(12) United States Patent
Bulzacchelli et al.

(10) Patent No.: US 7,893,861 B2
(45) Date of Patent: Feb. 22, 2011

(54) TIME-TO-DIGITAL BASED ANALOG-TO-DIGITAL CONVERTER ARCHITECTURE

(75) Inventors: John F. Bulzacchelli, Yorktown Heights, NY (US); Daniel J. Friedman, Yorktown Heights, NY (US); Shahrzad Naraghi, Austin, TX (US); Sergey V. Rylov, Yorktown Heights, NY (US); Alexander V. Rylyakov, Yorktown Heights, NY (US); Zeynep Toprak-Deniz, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/494,496

(22) Filed: Jun. 30, 2009

(65) Prior Publication Data
US 2010/0328130 A1 Dec. 30, 2010

(51) Int. Cl.
*H03M 1/50* (2006.01)
(52) U.S. Cl. .................. 341/166; 341/155
(58) Field of Classification Search .......... 341/118, 341/143, 120, 144, 155, 166; 327/146, 147; 331/18
See application file for complete search history.

(56) References Cited

U.S. PATENT DOCUMENTS

| 6,177,901 | B1 | 1/2001 | Pan et al. | |
|---|---|---|---|---|
| 6,417,714 | B1 | 7/2002 | Biyabani et al. | |
| 7,205,924 | B2 | 4/2007 | Vemulapalli et al. | |
| 2006/0103566 | A1 | 5/2006 | Vemulapalli et al. | |
| 2008/0267280 | A1 | 10/2008 | Yousif et al. | |
| 2009/0141595 | A1* | 6/2009 | Huang et al. | 368/118 |
| 2010/0034056 | A1* | 2/2010 | Henzler et al. | 368/107 |

* cited by examiner

*Primary Examiner*—Brian Young
(74) *Attorney, Agent, or Firm*—Tutunjian & Bitetto PC; Anne V. Dougherty, Esq.

(57) ABSTRACT

Apparatus and methods are provided relating to time-to-digital based analog-to-digital converter. An apparatus includes a time-to-digital converter based analog-to-digital converter for generating a first signal and a second signal having a timing relationship between a rising edge of the first signal and a rising edge of the second signal based on a sampled input analog voltage level, and converting the timing relationship into a corresponding time-to-digital representation. The time-to-digital representation is obtained without any voltage comparison and current comparison.

25 Claims, 10 Drawing Sheets

TIME-TO-DIGITAL BASED ANALOG-TO-DIGITAL CONVERTER ARCHITECTURE

GOVERNMENT RIGHTS

This invention was made with Government support under Contract No.: H98230-07-C-0409 awarded by the National Security Agency (NSA). The Government has certain rights in this invention.

BACKGROUND

1. Field of Invention

The present invention relates generally to time-to-digital converter (TDC) based analog-to-digital converter (ADC) architectures and, more specifically to a TDC based ADC architecture.

2. Description of the Related Art

Advances in complimentary metal-oxide semi-conductor (CMOS) technologies have dramatically improved the performance of systems which generally require an analog-to-digital converter (ADC) for an interface. These advances eventually led to a corresponding increase in data-converter performance. In such systems, the importance of analog to digital conversion is becoming crucial as analog to digital conversion itself is starting to become the system bottleneck in performance as well as power consumption. In addition, there is the continuous trend toward integration which favors the digitalization of parts or even the complete signal processing as opposed to its analog counterpart, e.g., all-digital phase locked loops (PLLs). Moreover, some of the challenges in designing ADCs in such scaled CMOS technologies include, for example, higher resolution, wider bandwidth requirements to support higher sampling rates, reduced dynamic range and hence signal-to-noise ratio, smaller foot print, and stringent power dissipation specifications. Thus, new and more energy efficient circuit architectures meeting such challenges are essential as analog device characteristics are expected to steadily degrade in sub-micron/sub-1V CMOS technologies.

BRIEF SUMMARY

According to an aspect of the present principles, there is provided an apparatus. The apparatus includes a time-to-digital converter based analog-to-digital converter for generating a first signal and a second signal having a timing relationship between a rising edge of the first signal and a rising edge of the second signal based on a sampled input analog voltage level, and converting the timing relationship into a corresponding time-to-digital representation. The time-to-digital representation is obtained without any voltage comparison and current comparison.

According to another aspect of the present principles, there is provided a method. The method includes generating a time-to-digital representation from a sampled input analog voltage level using a time-to-digital based analog-to-digital converter. The generating step includes generating a first signal and a second signal having a timing relationship between a rising edge of the first signal and a rising edge of the second signal based on a sampled input analog voltage level. The generating step also includes converting the timing relationship into a corresponding time-to-digital representation. The time-to-digital representation is obtained without any voltage comparison and current comparison.

According to yet another aspect of the present principles, there is provided an apparatus. The apparatus includes a linear voltage to delay converter having a plurality of stages of dynamic gates. Each of the plurality of stages of dynamic gates is followed by at least one static gate. Each of the plurality of stages of dynamic gates has a respective output node coupled to a respective constant current source using a respective pull-down path. Output nodes for all of the plurality of stages are pre-charged to an input analog voltage level and, sequentially for each of the plurality of stages so as to form a sequential release of each of the plurality of stages, the respective output node for a first one of the plurality of stages of dynamic gates is discharged in an evaluation phase with the respective constant current source using the respective pull-down path so as to reach the gate threshold of the following at least one static gate and change a voltage level of the following at least one static gate such that a subsequent one of the plurality of stages of dynamic gates is enabled for a corresponding evaluation phase there for.

According to a further aspect of the present principles, there is provided a method. The method includes performing a linear voltage to delay conversion using a linear voltage to delay converter having a plurality of stages of dynamic gates. Each of the plurality of stages of dynamic gates is followed by at least one static gate. Each of the plurality of stages of dynamic gates has a respective output node coupled to a respective constant current source using a respective pull-down path. The performing step includes pre-charging output nodes for all of the plurality of stages to an input analog voltage level. The pre-charging step also includes sequentially for each of the plurality of stages so as to form a sequential release of each of the plurality of stages, discharging in an evaluation phase the respective output node for a first one of the plurality of stages of dynamic gates with the respective constant current source using the respective pull-down path so as to reach a static gate threshold of the following at least one static gates and change a voltage level of the following at least one static gate such that a subsequent one of the plurality of stages of dynamic gates is enabled for a corresponding evaluation phase there for.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
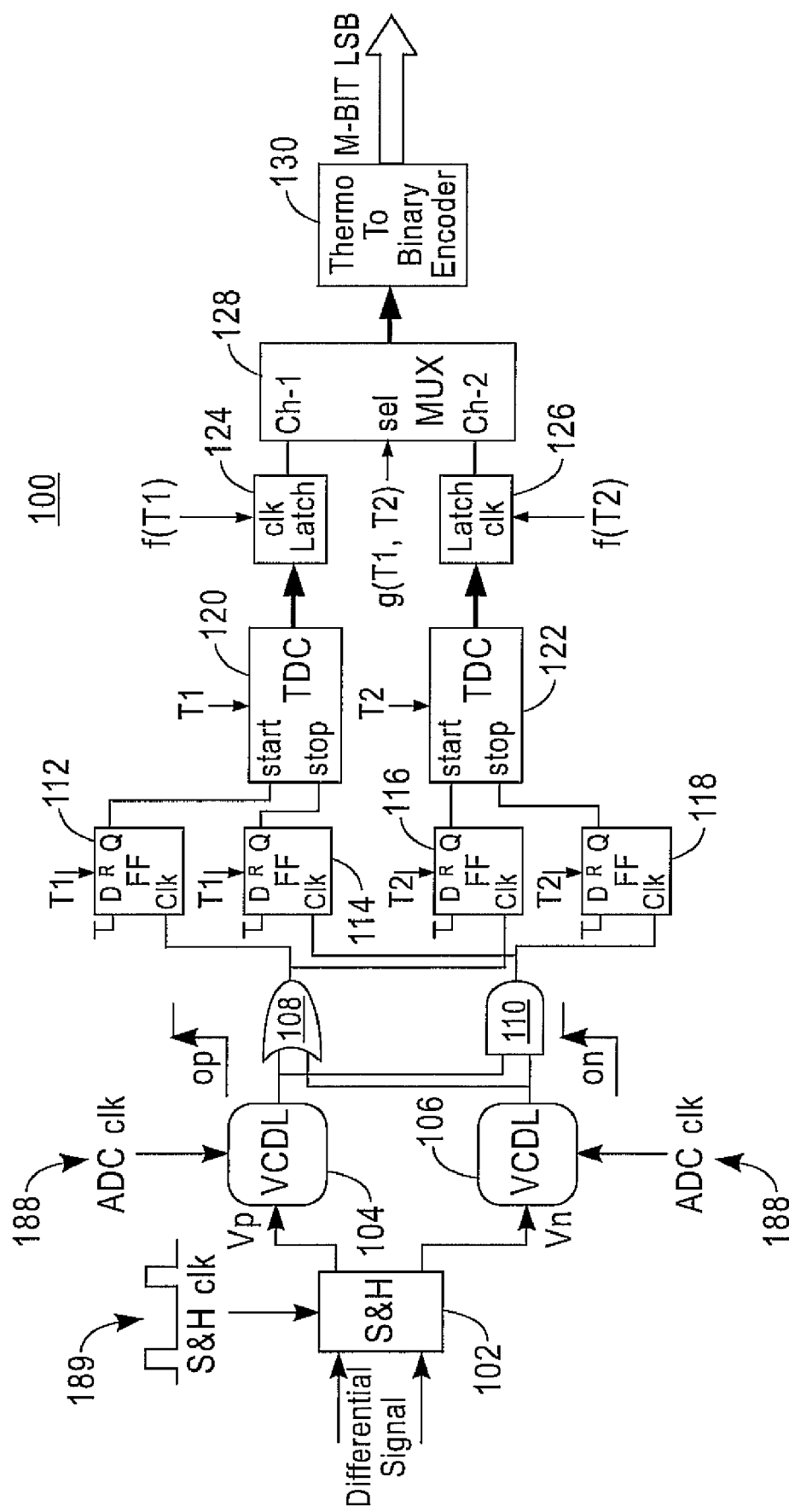
FIG. 1 is a diagram for an exemplary time-to-digital converter (TDC) based analog-to-digital converter (ADC) architecture 100, in accordance with an embodiment of the present principles.
Figure 3:
FIG. 3 is a timing diagram for an exemplary sample and hold (S&H) clock signal 189 that is the clock input to the sample and hold 102 of FIG. 1, in accordance with an embodiment of the present principles.

Referring now to the drawings in which like numerals represent the same or similar elements and initially to FIG. 1, an exemplary time-to-digital converter (TDC) based analog-to-digital converter (ADC) architecture 100 is shown. The TDC based ADC architecture 100 includes a sample and hold (S&H) 102 having first and second inputs for receiving a differential input signal, and third and fourth inputs for receiving a differential S&H clock signal 189 (as shown in FIG. 3). The S&H 102 also has differential outputs (Vp) and (Vn) connected in signal communication with a first input of a voltage controlled delay line (VCDL) 104 and a first input of a VCDL 106, respectively. A second input of the VCDL 104 receives an ADC clock signal 188, and a second input of the VCDL 106 receives the ADC clock signal 188. An output of the VCDL 104 is connected in signal communication with a first input of an OR gate 108 and a first input of an AND gate 110. An output of the VCDL 106 is connected in signal communication with a second input of the OR gate 108 and a second input of the AND gate 110. An output of the OR gate 108 is connected in signal communication with respective clock inputs of a D flip-flop 112 and a D flip-flop 116. An output of the AND gate 110 is connected in signal communication with clock input of a D flip-flop 114 and a D flip-flop 118. The respective data (D) inputs of D flip-flops 112, 114, 116, and 118 are connected to a high logic level. A Q output of the D flip-flop 112 is connected in signal communication with a start input of a TDC 120. A Q output of the D flip-flop 114 is connected in signal communication with a stop input of the TDC 120. A Q output of the D flip-flop 116 is connected in signal communication with a start input of a TDC 122. A Q output of the D flip-flop 118 is connected in signal communication with a stop input of the TDC 122. An (N-bit) output of the TDC 120 is connected in signal communication with a data input of a latch 124. An (N-bit) output of the TDC 122 is connected in signal communication with a data input of a latch 126. A clock input of the latch 124 receives a clock signal f(T1), and a clock input of the latch 126 receives a clock signal f(T2), where f(T1) represents a phase of the T1 signal, and f(T2) represents a phase of the T2 signal. An (N-bit) output of the latch 124 is connected in signal communication with a channel-1 (N-bit) input of a multiplexer 128. An (N-bit) output of the latch 126 is connected in signal communication with a channel-2 (N-bit) input of the multiplexer 128. A selector input of the multiplexer receives a signal g(T1, T2). An (N-bit) output of the multiplexer 128 is connected in signal communication with a thermometer-to-binary encoder 130. An (M-bit) output of the thermometer-to-binary encoder 130 provides the M (4 in this particular example) least significant bits (LSB) of the conversion. In the preceding, variables N and M, as used with respect to "N-bit" and "M-bit", represent respective different integers greater than one.

It is to be appreciated that at least the OR gate 108 and the AND gate 110 form an AND/OR first-arrival-detection circuit 199 which operates as described in further detail herein below. Moreover, it is to be appreciated that the specific configuration of FIG. 1 is merely illustrative and, thus, variations thereto to the overall circuit or one or more portions thereof, as would be readily contemplated by one of ordinary skill in this and related arts, are considered within the spirit of the present principles. For example, while some elements show a single input or a single output, it is to be appreciated that in other embodiments, such elements may include more than one input or more than one output. Moreover, as a further example, while particular numbers of bits are associated with various inputs and outputs for illustrative purposes, in other embodiments other numbers of bits may also be used. Further, while TDCs 120 and 122 are shown generically, one or both of TDCs 120 and 122 may be a Vernier type TDC, a delay line based semi-Vernier type TDC, a voltage controlled oscillator (VCO) based TDC, and/or so forth. Of course, other variations are also possible and within the spirit of the present principles.

Figure 2:
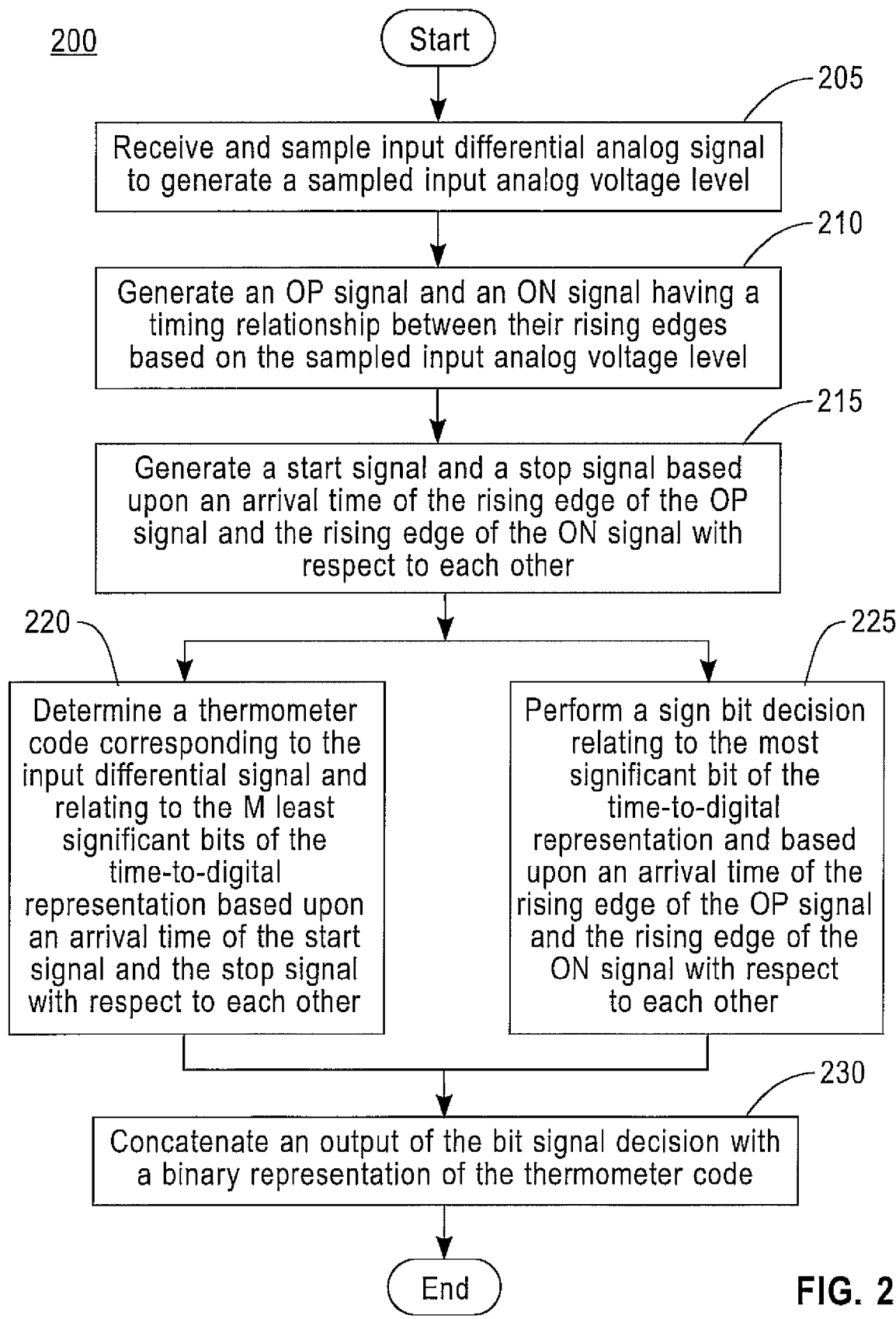
FIG. 2 is a flow diagram for a method for time-to-digital (TDC) based analog to digital conversion, in accordance with an embodiment of the present principles.

FIG. 2 shows a method 200 for time-to-digital converter (TDC) based analog to digital conversion, in accordance with an embodiment of the present principles. The method 200 may be implemented with respect to, for example, the TDC based ADC architecture 100 of FIG. 1. At step 205, an input differential analog signal is received and sampled to generate a sampled input analog voltage level. At step 210, an op signal and an on signal are generated having a timing relationship between their rising edges based upon the sampled input analog voltage level. At step 215, a start signal and a stop signal are generated based upon an arrival time of the rising edge of the op signal and the rising edge of the on signal with respect to each other. At step 220, a thermometer code corresponding to the input differential signal and relating to the M least significant bits of the time-to-digital representation is determined based upon an arrival time of the START signal and the STOP signal with respect to each other. In an embodiment, the START signal is generated as soon as the first of the two rising edges arrives at first-arrival-detection circuit 199 (with OR gate 108). In an embodiment, the STOP signal stamps the time of the second rising edge arrival with respect to first rising edge (with AND gate 110). At step 225, a sign bit decision is performed relating to determining the most significant bit of the time-to-digital representation and based upon an arrival time of the rising edge of the op signal and the rising edge of the on signal with respect to each other. It is to be appreciated that step 225 is performed in parallel with at least a portion of the processing time relating to the least significant bits of the time-to-digital representation. For example, in the illustrative embodiment of FIG. 2, steps 220 and 225 are shown in parallel. At step 230, an output of the bit signal decision, representative of the most significant bit of the time-to-digital representation, is concatenated with the binary representation of the generated thermometer code.

FIG. 3 shows an exemplary sample and hold (S&H) clock signal 189 that is clock input to the sample and hold 102 of FIG. 1, in accordance with an embodiment of the present principles. This is a rail-to-rail signal with square wave form having a duty cycle different or equal to 50%.

Figure 4:
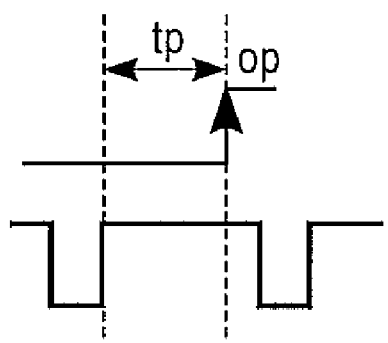
FIG. 4 is a timing diagram for an exemplary timing 400 of an OP signal that is output from the voltage controlled delay line (VCDL) 104 of FIG. 1 with respect to a clock input, in accordance with an embodiment of the present principles.

FIG. 4 shows an exemplary timing 400 of the OP signal that is output from the voltage controlled delay line (VCDL) 104 of FIG. 1 with respect to a clock input, in accordance with an embodiment of the present principles. The OP signal is based on the sampled analog voltage level. TP is the time for the OP rising edge to be generated based on the analog voltage level with respect to the ADC clock rising edge.

Figure 5:
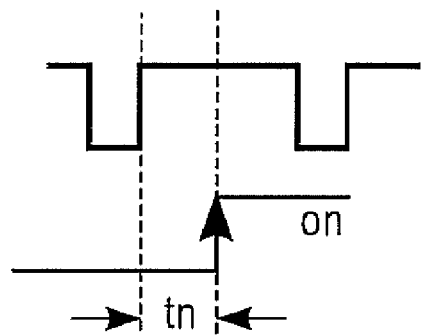
FIG. 5 is a timing diagram for an exemplary timing 500 of an ON signal that is output from the VCDL 106 of FIG. 1 with respect to a clock input, in accordance with an embodiment of the present principles.

FIG. 5 shows an exemplary timing 500 of the ON signal that is output from the VCDL 106 of FIG. 1 with respect to a clock input, in accordance with an embodiment of the present principles. The ON signal is based on the other polarity of the sampled analog voltage level. TN is the time for the ON rising edge to be generated based on the analog voltage level with respect to the ADC clock rising edge.

Figure 6:
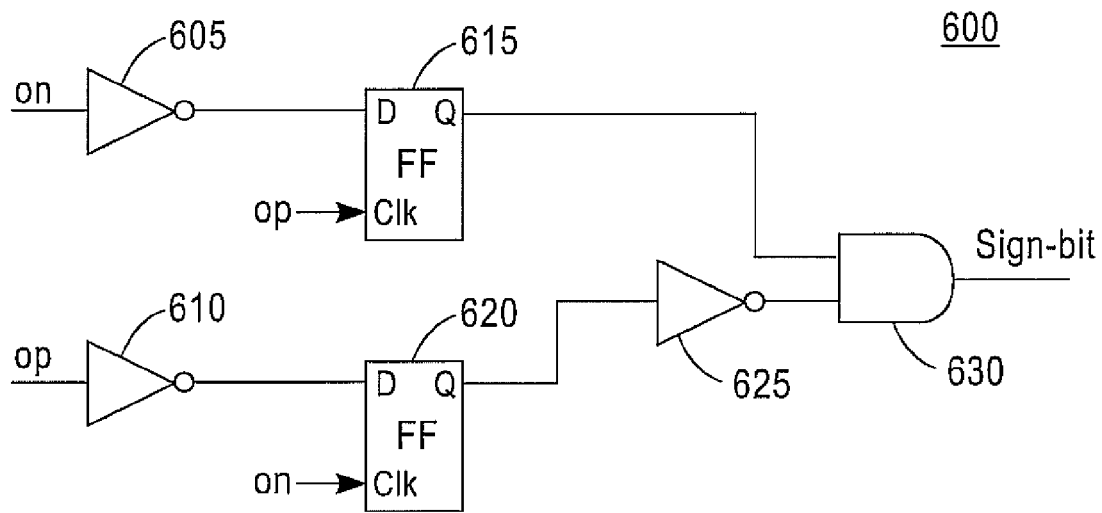
FIG. 6 is a diagram for an exemplary sign bit circuit 600 relating to the TDC based ADC architecture of FIG. 1, in accordance with an embodiment of the present principles.

FIG. 6 shows an exemplary sign bit circuit 600 relating to the TDC based ADC architecture of FIG. 1, in accordance with an embodiment of the present principles. The sign bit circuit 600 is used in a decision phase as described in further detail herein below. The sign bit circuit 600 includes an inverter 605 for receiving the "on" signal and an inverter 610 for receiving the "op" signal. An output of the inverter 605 is connected in signal communication with a D input of a D flip-flop 615. An output of the inverter 610 is connected in signal communication with a D input of a D flip-flop 620. A clock input of the D flip-flop 615 receives the "op signal. A clock input of the D flip-flop 620 receives the "on signal. A Q output of the D flip-flop 615 is connected in signal communication with a first input of an AND gate 630. A Q output of the D flip-flop 620 is connected in signal communication with an input of an inverter 625. An output of the inverter 625 is connected in signal communication with a second input of AND gate 630. An output of AND gate 630 provides a sign bit output.

It should be appreciated that this implementation is not the only way to detect the sign bit (the MSB of the time-to-digital representation). For example, one can use a simpler circuit where OP is connected to an input of a buffer and ON is connected to an input of an inverter. The output of the OP buffer is connected to the CLK input of a DFF and the output of the ON inverter is connected to the data input (D) of the same DFF. A Q output of the aforementioned DFF is the sign bit for the given conversion.

It should be understood that the elements shown in the FIGURES may be implemented in various forms of hardware, software or combinations thereof.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., Graphic Data System II (GDSII)) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

One way to surmount the above mentioned of analog-to-digital (A/D) design in the above mentioned technologies is to process the signal in the time domain. Since time resolution improves despite the reduction in supply voltage and/or degradation of analog device characteristics, time-domain signal processing offers a better solution compared to that of the existing voltage-based or existing current-based methods. As opposed to conventional analog-to-digital converters which rely on voltage/current comparison for digital output code generation (and, hence, perform either a voltage domain or current domain comparison), the proposed architecture is a time-to-digital converter based ADC without voltage/current comparison for high-speed low-to-medium resolution applications including but not limited to, e.g., channel limited wire-line communication receivers. As used herein, the phrases "without voltage/current comparison" and "without voltage comparison and current comparison" refer to time domain signal processing, which can be handled as (1) voltage to frequency or (2) voltage to delay conversion, wherein data is processed in the time domain, i.e. time domain comparison is performed, to generate a digital representation of the given analog input signal.

For the purpose of cost reduction (reduced silicon area) and power savings, the proposed ADC generates two signals, an op signal and an on signal, with a timing relationship between their rising edges based on the sampled analog signal level. Then, the semi-Vernier time-to-digital converters 120, 122 are utilized to convert the-timing relation between the rising edges of two separate signals (i.e., op and on) into a corresponding time-to-digital representation in a time-interleaved fashion. Advantageously, most of the circuit has been constructed by digital circuit techniques enabling very low supply voltage operation. Thus, the proposed architecture also advantageously eases the implementation with fully digital systems. The proposed architecture is based on a two-step conversion executed in parallel, namely the sign bit, as generated by sign bit circuit 600, is used in the decision phase of the M LSBs and concatenated to those forming the final N-bit output code, thus further relaxing the resolution and linearity requirements on the semi-Vernier delay lines 104, 106. On the other hand, the meta-stability constraint on the sign bit decision is relaxed by using the AND/OR first-arrival-detection circuit 199 which allows the full Unit Interval (UI) to the sign bit decision. The two-step conversion technique has been implemented without the need to amplify the time residue. Also, the sign bit (output from AND gate 630) is directly concatenated to the M-LSBs (output from thermometer-to-binary encoder 130) since the implemented technique does not generate any stitching problem between the coarse and fine bit decisions. Furthermore, the proposed ADC architecture 100 is an ideal candidate to be utilized as the receiver front-end of high-speed serial links including, but not limited to, wire-line front ends. By doing so, digital feed forward equalization (FFE) can be easily embedded in the receiver, the number of filter taps can be made configurable, more advanced equalization approaches can be employed, and the primary benefit of the future technologies, i.e., higher logic density per area, can be utilized efficiently while achieving lower power consumption and smaller area.

Figure 7:
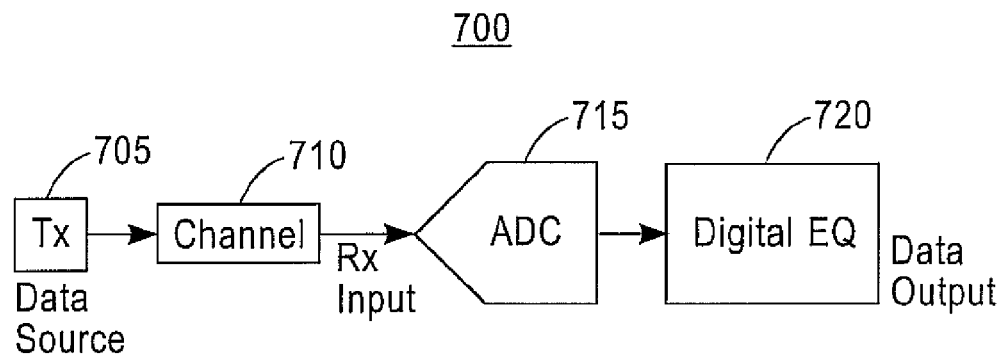
FIG. 7 is a diagram for an exemplary system 700 implementing digital equalization to which the present principles may be applied, in accordance with an embodiment of the present principles.

FIG. 7 shows an exemplary system 700 implementing digital equalization to which the present principles may be applied, in accordance with an embodiment of the present principles. The system 700 includes a transmitter (Tx) 705 having an output connected in signal communication with an input of a channel 710. Output of the channel 710 is connected in signal communication with input of an analog-to-digital converter (ADC) 715. Output of the ADC 715 is connected in signal communication with an input of a digital equalizer 720. It is to be appreciated that while the preceding embodiment relates to digital equalization, the present principles are not limited to solely the same and, thus, may be implemented with respect to a digital signal processor (DSP) that is capable of implementing digital equalization and/or other digital signal processing functions to which the present principles may be applied, in accordance with an embodiment of the present principles.

Referring back to FIG. 1, it can be seen that each quarter rate ADC is composed of two time interleaved TDC based ADCs sharing one sample-and-hold (S&H) block. The sampled-and-held differential analog signal is applied to the (first) inputs of the VCDLs 104, 106 generating two rising edges (on/op) delayed with respect to each other as a linear function of the input analog signal level. As the input analog signal amplitude increases, this generated delay increases linearly. The OR gate 108 and the AND gate 110 are used to determine which of these two rising edges arrives (is generated) first with respect to the other, generating the "START", "STOP" signals for the TDC (e.g., TDCs 120, 122) under use for the corresponding data sample. In parallel, the "sign bit/ MSB" decision is processed based on the op/on signals arrival time with respect to each other. By doing so, the TDC resolution is reduced by half resulting in lower power consumption and smaller area due to fewer numbers of components to be implemented. Also, with respect to FIG. 6, the meta-stability requirement on the D flip-flops (FFs) 615, 620 sampling op/on with on/op to generate the corresponding "sign bit" is relaxed by allowing the full UI for CLK-to-Q delay. Two couples of static CMOS flip-flops (FFs), which include D flip-flops 112, 114, 116, and 118, are used to sample and expand the START/STOP signals over the next data sample period for TDC and encoder processing, enabling a time interleaving technique.

Figure 8:
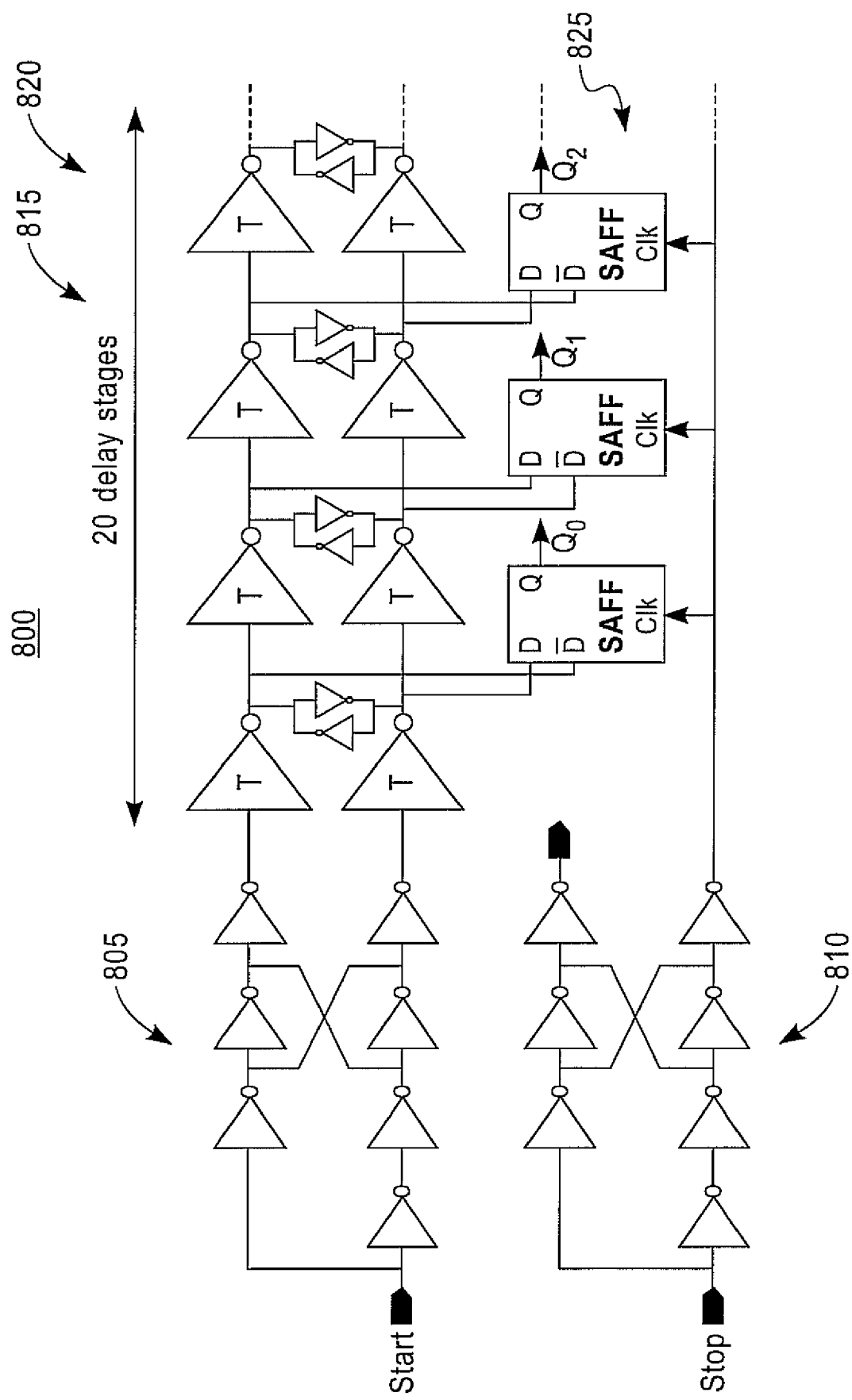
FIG. 8 is a diagram for an exemplary time-to-digital converter (TDC) structure 800 of the outputs of VCDL 104 and VCDL 106 of FIG. 1 in further detail, in accordance with an embodiment of the present principles.

FIG. 8 shows an exemplary time-to-digital (TDC) structure 800 for processing the outputs of the VCDL 104 and VCDL 106 of FIG. 1, in accordance with an embodiment of the present principles. The TDC structure 800 includes a first bank of inverters 805 to generate and de-skew the complementary phase of the START signal, and a second bank of inverters 810 to generate and de-skew the complementary phase of STOP signal. The TDC structure 800 further includes a plurality of delay stages 815. The delay stages include a plurality of inverters 820 and a plurality of sense amplifier based flip-flops 825. It is to be appreciated that while the number of delay stages in the illustrative embodiment of FIG. 8 numbers 20 in order to provide 4.3-bit resolution, other numbers of stages and other corresponding resolutions may also be used, while maintaining the spirit of the present principles.

In an embodiment, a semi/pseudo-Vernier delay line, implemented by at least delay stages 815, is used to delay the rising edge of the START bit an equal distance with 1 LSB resolution (10 ps) over 20 (4.3-bit) decision thresholds. Of course, the preceding values are merely illustrative and, thus, other values may also be used in accordance with the teachings of the present principles, while maintaining the spirit of the present principles. For example, the number of delay stages, the resolution, and the number of decision thresholds may all be varied, depending upon the implementation. The START bit being the first arrival signal sets the data inputs of the sense amplifier based flip-flops (SAFFs) 825 as it propagates along the semi-Vernier delay line. The arrival of the STOP signals corresponds to a rising edge clock (CLK) signal for the SAFFs 825, sampling the data inputs. Clock inputs of these SAFFs 825 are fed with the STOP signal. That is, the arrival instant of the STOP signal determines the thermometer code in the TDC corresponding to the analog input signal. With the next rising edge of the system CLK, these thermometer bits are latched (by latches 124, 126) and fed into the MUX 128. Consequently, the MUX outputs are encoded into a M-bit binary code by the thermometer-to-binary encoder 130. Then the sign (output from the sign bit circuit 600) is concatenated as the MSB to the M LSB from the encoder 130.

Figure 9:
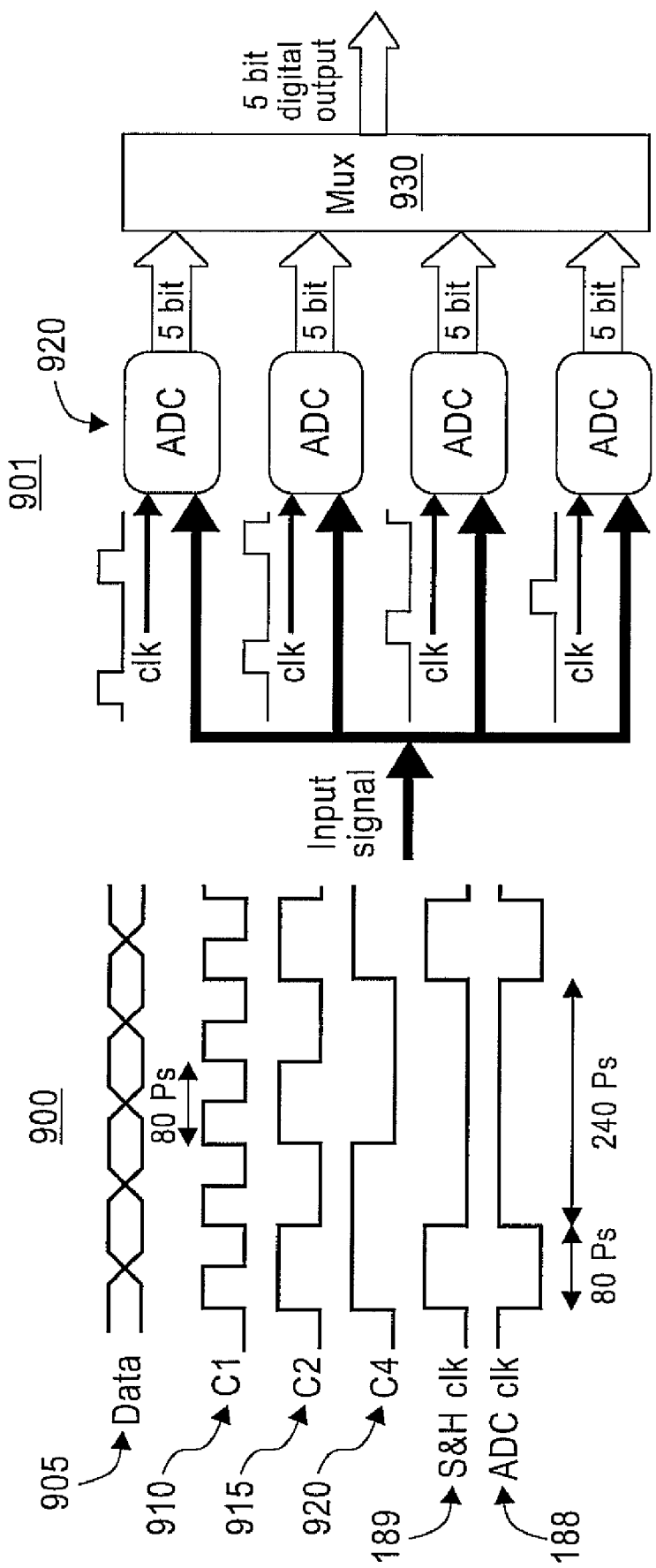
FIG. 9 is a timing diagram for an exemplary timing 901 of signals 900 for the proposed 4-way time interleaved TDC based ADC architecture 100 of FIG. 1 in an implementation relating to a 12.5 Gbps serial link, in accordance with an embodiment of the present principles.

FIG. 9 shows an exemplary timing 901 of signals 900 for the proposed 4-way time interleaved TDC based ADC architecture 100 of FIG. 1 in an implementation relating to a 12.5 Gbps serial link, in accordance with an embodiment of the present principles. Of course, given the teachings of the present principles provided herein, it is to be appreciated that the proposed architecture is not limited to only 4-way time interleaving and, thus, can be used as a stand alone (core) ADC, or as the building block of a 2/4/8 or more-way time interleaved architecture. In particular, the signals, collectively designated by the reference numeral 900, include a data signal 905, a C1 full rate clock signal 910, a C2 half rate clock signal 915, a C4 quarter rate clock signal 920, the S&H clock signal 189, and the ADC clock signal 188. For quarter rate architecture, 4 non-overlapping phases of S&H and ADC clocks are generated using C2 and C4 phases such that each quarter rate ADC receives a non-overlapping phase. It should be noted that each S&H and ADC clock pair is also non-overlapping. The input signals 900 are input to a group of ADCs 920 using a clock signal CLK, with each of the ADCs providing an N-bit output to a multiplexer 930. The multiplexer 930 then provides an N-bit digital output.

Figure 10:
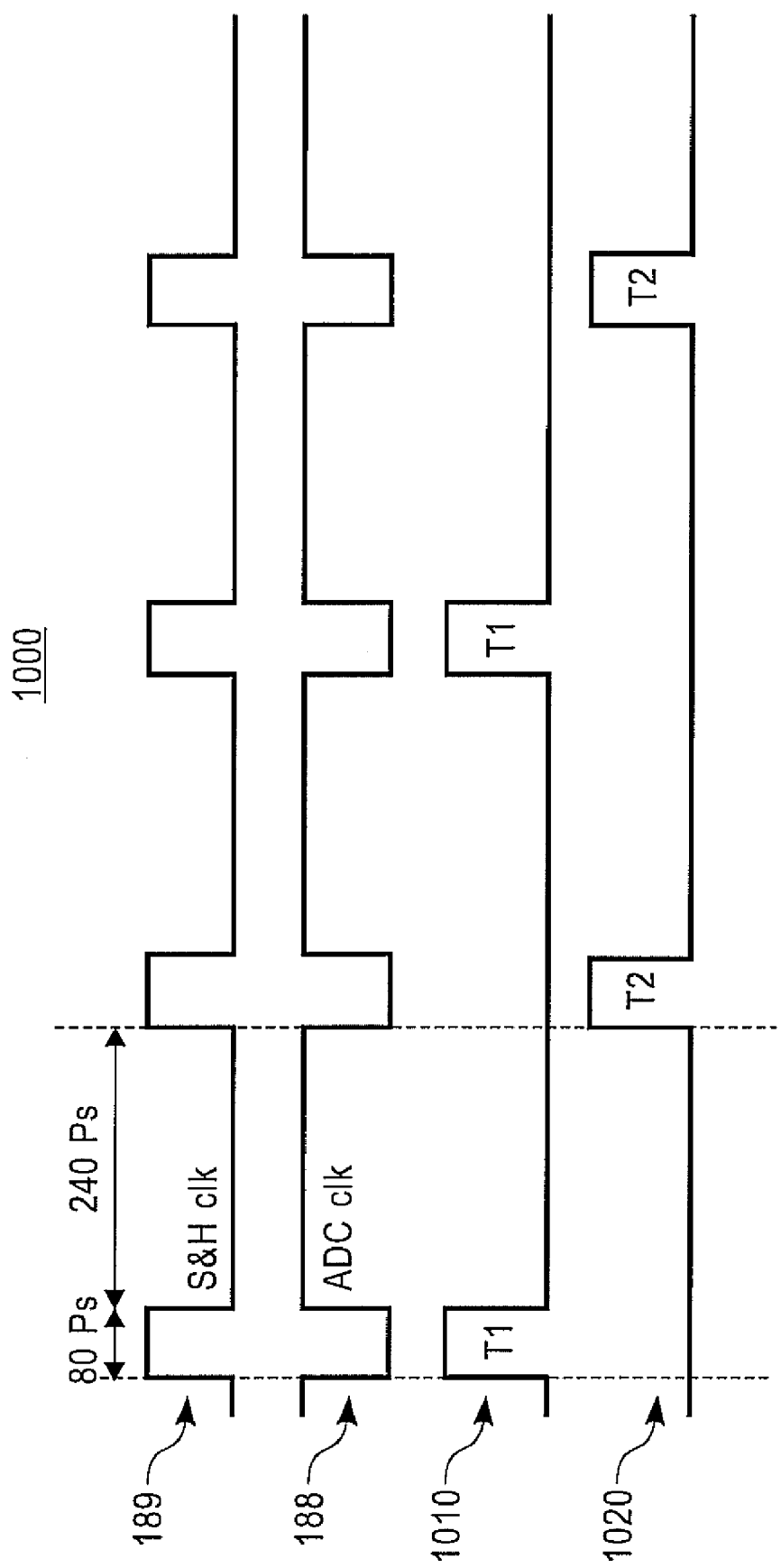
FIG. 10 is a timing diagram for toggling 1000 between TDC1 and TDC2, in accordance with an embodiment of the present principles.

FIG. 10 shows toggling 1000 between TDC1 and TDC2, in accordance with an embodiment of the present principles. In particular, the S&H signal 189, the ADC clock signal 188, a T1 signal 1010, and a T2 signal 1020, are involved. T1 and T2 phases are generated from S&H and ADC clocks. At a first time instance 1010, sampler FF1 (112 and 114) is reset and ready for the next sample, TDC1 is latched, and the data is provided to the encoder 130. At a second time instance 1020, sampler FF2 (116 and 118) is reset and ready for the next sample, TDC2 is latched, and data is provided to the encoder 130.

Some exemplary applications to which the present principles may be applied include but are not limited to the read channel of storage systems (with respect to, e.g., 5~7-bits, >1 GS/s), wired communication systems (with respect to, e.g., 4-bits, >1-20 GS/s, e.g., serial high speed links with MPAM modulation), wireless communication systems (with respect to, e.g., 4-bits, >500 MS/s), and digital oscilloscopes (with respect to, e.g., 6-bits, >1-20 GS/s). Of course, the preceding applications are merely illustrative and, given the teachings of the present principles provided herein, one of ordinary skill in this and related arts will contemplate these and various other applications to which the present principles may be applied, while maintaining the spirit of the present principles.

It is to be appreciated that the present principles provide one or more of the following advantages, depending upon the implementation: 5-bit resolution is achieved with 2-step conversion (early/late detection to generate MSB); no stitching problem of fine/coarse codes exists; time interleaving technique used to further decrease the power consumption and to relax critical timing path (e.g., MSB decision, encoder); and early/late detection enables to use a simple delay line based TDC compared to a complicated Vernier delay line. Hence, it is easier to design, and faster to map to a new technology.

In an embodiment, we provide a very compact circuit solution for a linear voltage to delay converter (LVDC) with high linearity, low power consumption, and small area for low-to-medium resolution A/D converters based on TDC techniques. The proposed LVDC may be used, for example, as VCDL 104 and/or VCDL 106 in FIG. 1

Figure 11:
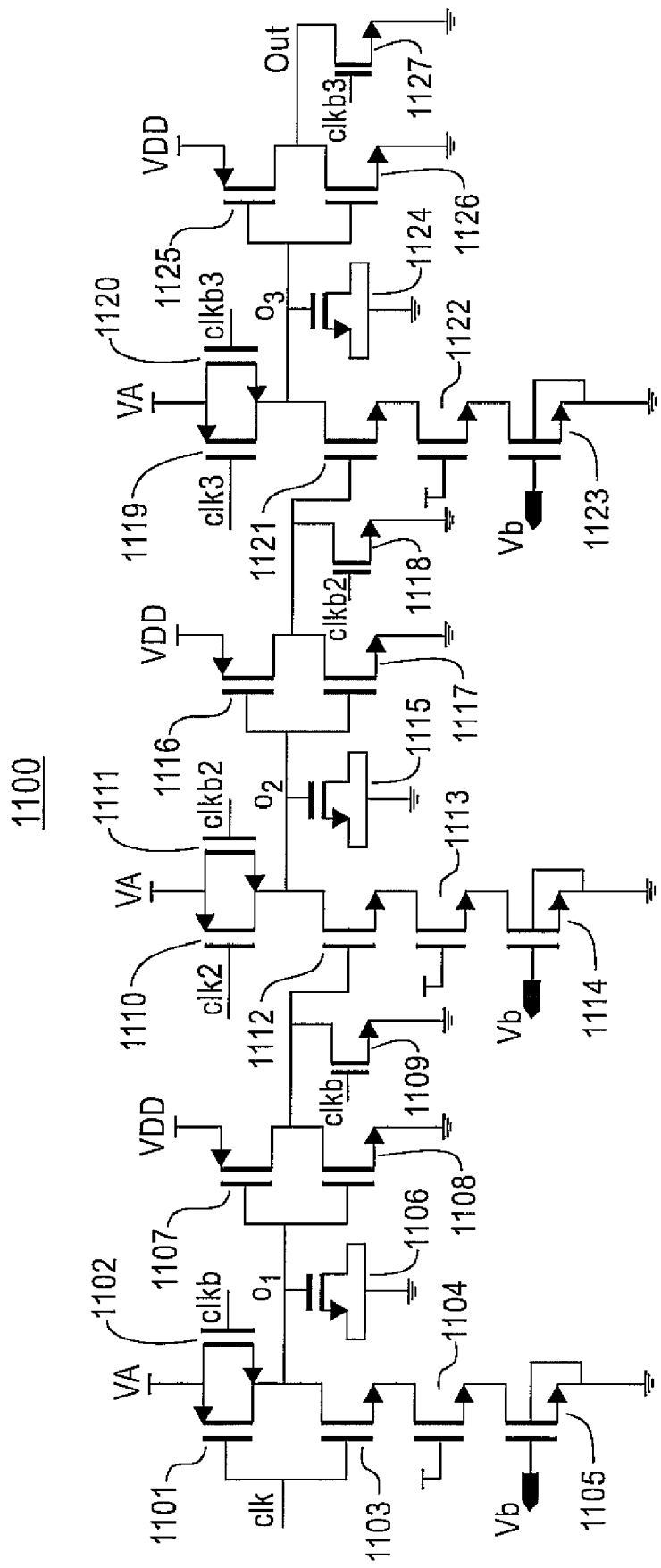
FIG. 11 is a diagram for an exemplary linear voltage to delay converter (LVDC) 1100, in accordance with an embodiment of the present principles.
Figure 12:
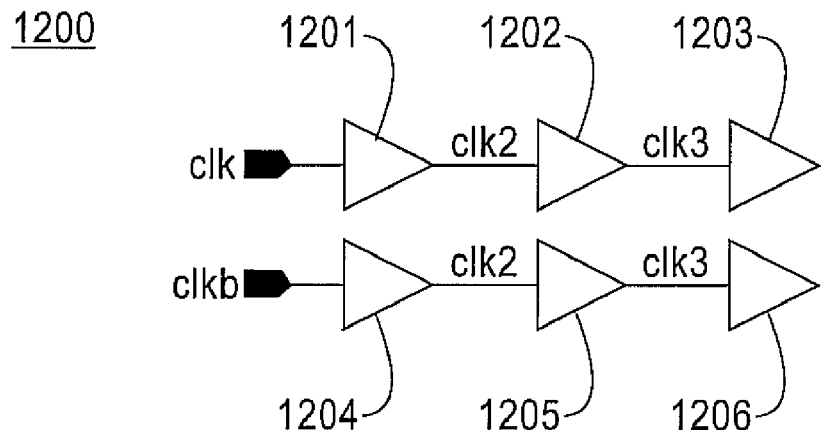
FIG. 12 shows an exemplary clock signal circuit 1200 for the LVDC 1100 of FIG. 11, in accordance with an embodiment of the present principles.

FIG. 11 shows an exemplary linear voltage to delay converter (LVDC) 1100, in accordance with an embodiment of the present principles. FIG. 12 shows an exemplary clock signal circuit for the LVDC 1100 of FIG. 11, in accordance with an embodiment of the present principles. The linear voltage to delay converter 1100 includes three stages of dynamic gates followed by a group of static gates (static inverters).

In further detail, considering each active element from among the three stages as a dynamic gate, the first stage 1101 includes a dynamic gate formed from NFET transistors 1103, 1104, and 1005, and a static inverter formed from an NFET transistor 1108 and a PFET transistor 1107. The second stage 1102 includes a dynamic gate formed from NFET transistors 1112, 1113, and 1114, and a static inverter formed from an NFET transistor 1117 and a PFET transistor 1116. The third stage 1103 includes a dynamic gate formed from NFET transistors 1121, 1122, and 1123, and a static inverter formed from an NFET transistor 1126 and a PFET transistor 1125. The clock circuit 1200 includes buffers 1201, 1202, 1203, 1204, 1205, and 1206.

The dynamic gates are pre-charged to the input voltage and, in an evaluation phase, the dynamic gate output nodes are discharged with a constant current source. As each of the dynamic gate output node voltages reaches the following static gate threshold, the output of these same static gates goes to a high logic level enabling the second dynamic gate in a sequential manner. Thus, the operation of the LVDC cell is a sequential process such that preceding stage (composed of a dynamic gate and a static inverter) triggers the evaluation phase of the following stage and so on. As the applied analog voltage level increases/decreases the time required to discharge the dynamic gate output to static inverter threshold increases/decreases linearly and hence the total delay increases/decreases. Thus, the total delay of this stage is proportional to the applied analog voltage. This sequential release technique of the dynamic gates reduces the effect of the pull-down path's leakage on the pre-charged node (i.e., the dynamic gate's output node) and enhances the achievable linearity since the dynamic node voltages will be equal (with negligible error due to mismatch, on resistance of the transmission gate, and so forth) to the applied analog signal at the beginning of each evaluation cycle and, hence, the inserted delay will be proportional to the input voltage. Furthermore, the delay between the generated output rising edge and the CLK rising edge is thus proportional to the input voltage. As an example, the pull-down path for node of is formed from NFET transistors 1103, 1104 and 1105, the pull-down path for node o2 is formed from NFET transistors 1112, 1113, and 1114, and the pull-down path for node o3 is formed from NFET transistors 1121, 1122, and 1123.

It is to be appreciated that while NFET transistors are shown in FIG. 11, the present principles are not limited solely to the preceding and, thus, other types of FETs and/or other active elements may be used in accordance with the teachings of the present principles, while maintaining the spirit of the present principles.

Figure 13:
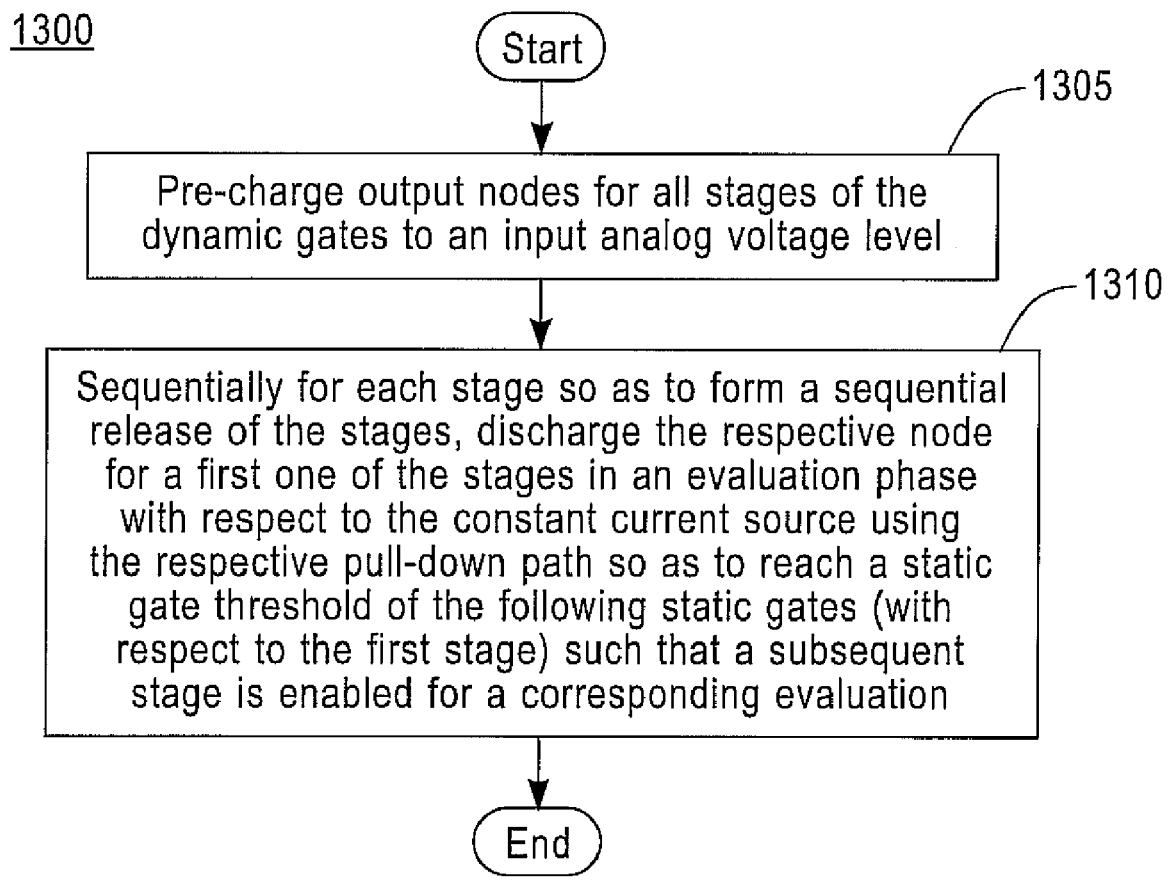
FIG. 13 is a flow diagram for a method 1300 for linear voltage to delay conversion, in accordance with an embodiment of the present principles.

FIG. 13 shows a method 1300 for linear voltage to delay conversion, in accordance with an embodiment of the present principles. The method 1300 may be implemented with respect to, for example, a linear voltage to delay converter having a plurality of stages of dynamic gates, where each stage is followed by one or more static gates and has a respective output node coupled to a respective constant current source using a respective pull-down path. Thus, for example, the method 1300 may be implemented with respect to the LVDC 1100 of FIG. 11. At step 1305, the output nodes for all of the plurality of stages of dynamic gates are pre-charged to the sampled input analog voltage level. At step 1310, sequentially for each stage so as to form a sequential release of the stages, the respective node for a first one of the plurality of dynamic stages is discharged in an evaluation phase with the respective constant current source using the respective pull-down path so as to reach the static gate threshold of the following static gates (with respect to the first stage) such that a subsequent stage is enabled for a corresponding evaluation phase.

Returning to FIG. 11, as noted above, the LVDC 1100 is composed of three stages of dynamic gates followed by static inverters. The dynamic gates supply voltage nodes (o1, o2, and o3) are connected to the analog input voltage (VA) through transmission gates. When the corresponding clock (CLK, CLK2, and CLK3) is low, outputs o1, o2 and o3 are pre-charged to VA. With the rising edge of the CLK, the dynamic gates enter an evaluation phase. With the rising edge of the CLK, the transmission gates connecting of nodes to VA are disabled and, thus, these nodes are discharged to ground with a constant current source as the pull-down path is enabled sequentially for each stage. It should be noted that the evaluation phase is a sequential operation starting from node o1 and explained as follows.

The dynamic gate delay equation can be approximated by Equation 1 as follows:

$$(VA - V_{th}) = \frac{I_p}{C_L} t_d \qquad \text{(Eq. 1)}$$

The dynamic gate delay is the time required to discharge the output node from VA to the static gate threshold voltage, Vth, by the constant current Ip which is defined by the dynamic gate pull down path. CL is the output capacitances dominated by the MOS capacitances in FIG. 11. As the first static gate output goes high, the second dynamic gate starts the evaluation, hence node o2 is discharged to ground and as this node voltage reaches the static gate threshold the third dynamic gate enters the evaluation phase discharging node o3 towards ground. The overall delay from CLK rising edge to the OUT (FIG. 11) rising edge, can be written as in Equation 2 as follows: and, thus, is linearly proportional to the analog input:

$$t_d = 3 \cdot \left(\frac{C_L}{I_p}\right) \cdot (VA - V_{th}) \qquad \text{(Eq. 2)}$$

A description of the clocking scheme of the LVDC 1100 of FIG. 11 will now be given, in accordance with an embodiment of the present principles. As shown in FIG. 11, clock signals releasing the transmission gates used to pre-charge nodes of to VA are delayed with buffers. Thus, the dynamic nodes will be released in a sequence. By doing so, it is quarantined that the pull down path leakage can not discharge the dynamic node significantly before the gate starts the evaluation. The delays can be either fixed delays provided that they are smaller than the shortest delay of the dynamic gates themselves or can be dependent on the analog input voltage generating a feed-forward path in the dynamic gates clocking. In the latter case, the leakage will be reduced significantly and linearity will improve. However, we have shown that implementing the first approach reduces the leakage to desired levels for 7-bit linearity. Thus, we used the first approach as it is easier to implement with a smaller area and power overhead.

A description of the noise performance of the LVDC 1100 of FIG. 11 will now be given, in accordance with an embodiment of the present principles.

The LVDC 1100 uses a similar principle as the single slope converter technique in which a capacitor is charged to the input voltage and then it is discharged with a constant current. The discharge time is proportional to the input voltage level.

In this scheme the discharging period is divided in three stages. Of course, it is to be appreciated that number of stages can be increased at the cost of higher insertion delay, while maintaining the spirit of the present principles. The advantage of this scheme is having smaller time jitter as shown with respect to FIGS. 14 and 15.

Figure 14:
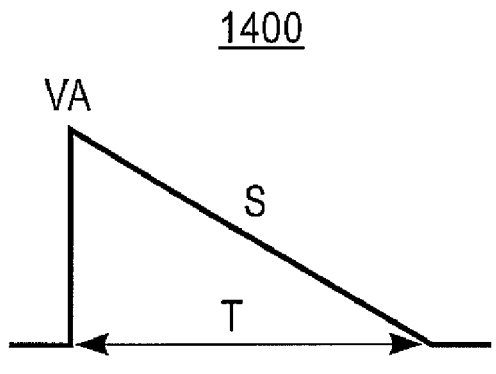
FIG. 14 shows an exemplary waveform 1400 representing an input/output relationship of a single dynamic gate of FIG. 11, in accordance with an embodiment of the present principles.

FIG. 14 shows an exemplary waveform 1400 representing an input/output relationship of a single dynamic gate of FIG. 11, in accordance with an embodiment of the present principles. In further detail, the input/output relationship relates to the input (i.e., analog input voltage (VA))–the output (delay-T) of a single dynamic gate of FIG. 11 with 3*Ip as the constant discharging current or CL/3 as the output node capacitance.

Figure 15:
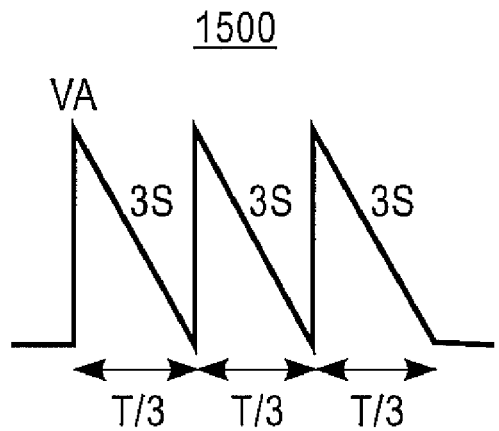
FIG. 15 is a diagram for exemplary waveforms 1500 relating to the analog input voltage (VA) applied to the dynamic gates of FIG. 11 as delayed by the three dynamic stages of the LVDC 1100, in accordance with an embodiment of the present principles.

FIG. 15 shows exemplary waveforms 1500 relating to the analog input voltage (VA) applied to the dynamic gates of FIG. 11 as delayed by the three dynamic stages of the LVDC 1100, in accordance with an embodiment of the present principles.

Time jitter can be written in terms of the intrinsic comparator and the ramp (denoted as Vn) noise divided by the discharging slope. Presuming Vn is same in both schemes, the total noise will be reduced by three in the proposed voltage-to-delay converter.

Figure 16:
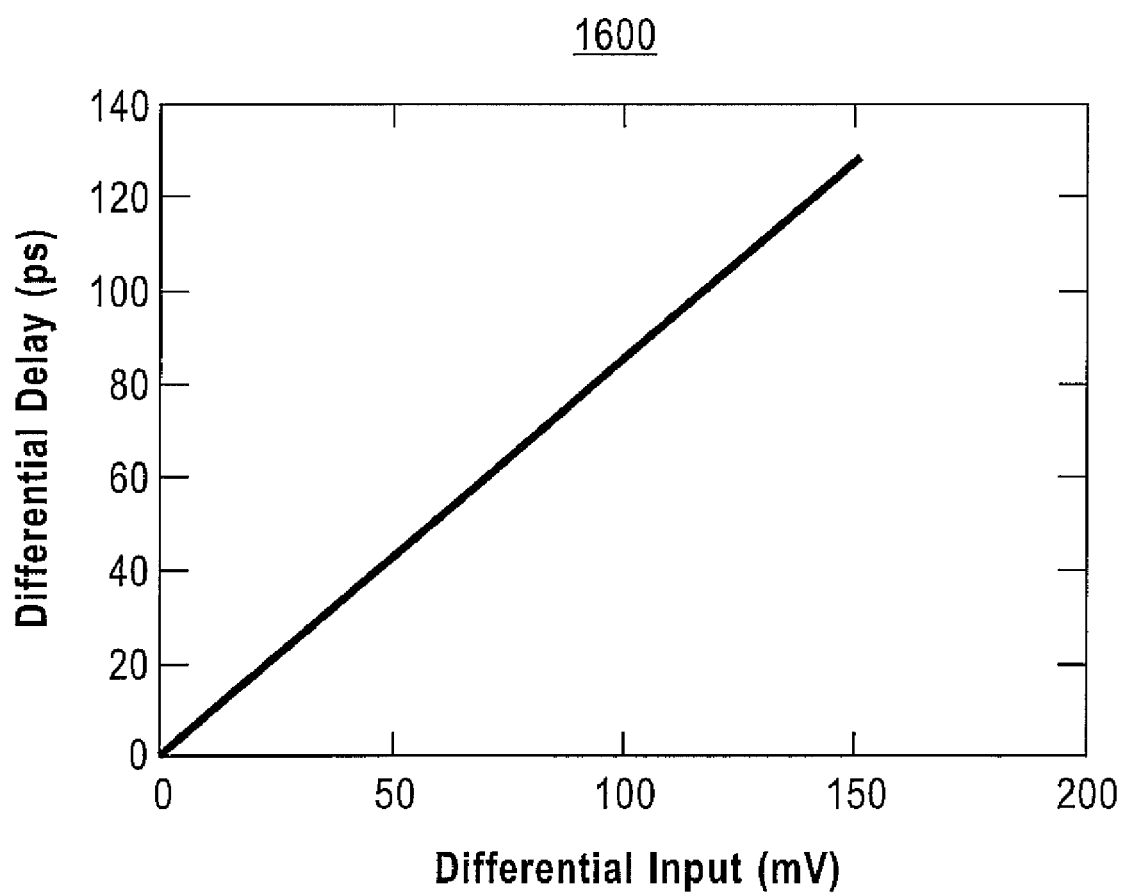
FIG. 16 is an exemplary simulated linearity plot 1600 involving differential delay (ps) versus differential input (mV), in accordance with an embodiment of the present principles.

FIG. 16 shows an exemplary simulated linearity plot 1600 involving differential delay (ps) versus differential input (mV), in accordance with an embodiment of the present principles. A 7-bit linearity is achieved with a 0.852 ps/mV slope.

Advantageously, the present principles provide one or more of the following advantages, depending upon the implementation: 7-bit linearity with very low power consumption; a small foot print; a reduced intrinsic noise contribution; a modular design approach, such that more unit delay cells can be cascaded; and the architecture is compatible with advance technologies since no performance critical analog block is used.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. An apparatus, comprising:
    a time-to-digital converter based analog-to-digital converter for generating a first signal and a second signal having a timing relationship between a rising edge of the first signal and a rising edge of the second signal based on a sampled input analog voltage level, and converting the timing relationship into a corresponding time-to-digital representation,
    wherein the time-to-digital representation is obtained without any voltage comparison and current comparison.

2. The apparatus of claim 1, wherein the time-to-digital representation is obtained using a pseudo-Vernier time-to-digital converter.

3. The apparatus of claim 1, further comprising:
    a sample and hold for receiving an input differential analog signal and generating the sampled input analog voltage level;
    at least one voltage controlled delay line for receiving the sampled input voltage level and generating the first signal and the second signal there from;
    a logic circuit for generating a start signal and a stop signal based upon an arrival time of the rising edge of the first signal and the rising edge of the second signal with respect to each other; and at least one time-to-digital converter for determining a thermometer code corresponding to the input differential analog signal based upon an arrival time of the stop signal with respect to start signal.

4. The apparatus of claim 3, wherein at least one time-to-digital converter comprises at least one pseudo-Vernier line having a plurality of delay stages for delaying a rising edge of the start signal with a pre-specified resolution over a pre-specified number of decision thresholds.

5. The apparatus of claim 3, wherein an output of the at least one time-to-digital converter relates to least significant bits of the time-to-digital representation, and the apparatus further comprises:
a sign bit circuit for performing a sign bit decision relating to a most significant bit of the time-to-digital representation based upon the arrival time of the rising edge of the first signal and the rising edge of the second signal.

6. The apparatus of claim 5, wherein the sign bit decision is performed in parallel with at least a portion of a processing time relating to the least significant bits of the time-to-digital representation.

7. The apparatus of claim 5, wherein an output of the sign bit circuit, representative of the most significant bit, is concatenated with an output of the at least one time-to-digital converter to obtain the time-to-digital representation.

8. The apparatus of claim 1, wherein the time-to-digital converter based analog-to-digital converter comprises a first circuit portion for determining least significant bits and a second circuit portion for determining a most significant bit corresponding to the time-to-digital representation, wherein the first circuit portion and the second circuit portion are configured to operate at least partially in parallel.

9. The apparatus of claim 1, wherein the timing relationship is converted into the corresponding time-to-digital representation using time-interleaving.

10. A method, comprising:
generating a time-to-digital representation from a sampled input analog voltage level using a time-to-digital based analog-to-digital converter,
wherein said generating step comprises:
generating a first signal and a second signal having a timing relationship between a rising edge of the first signal and a rising edge of the second signal based on a sampled input analog voltage level; and
converting the timing relationship into a corresponding time-to-digital representation, wherein the time-to-digital representation is obtained without any voltage comparison and current comparison.

11. The method of claim 10, wherein the time-to-digital representation is obtained using a pseudo-Vernier time-to-digital converter comprised in the time-to-digital converter based analog-to-digital converter.

12. The method of claim 10, further comprising:
receiving an input differential analog signal and generating the sampled input analog voltage level;
receiving the sampled input voltage level and generating the first signal and the second signal there from using at least one voltage controlled delay line;
generating a start signal and a stop signal based upon an arrival time of the rising edge of the first signal and the rising edge of the second signal with respect to each other; and
determining a thermometer code corresponding to the input differential analog signal based upon an arrival time of the stop signal with respect to the start signal.

13. The method of claim 12, wherein said determining step comprises delaying a rising edge of the start signal with a pre-specified resolution over a pre-specified number of decision thresholds using at least one pseudo-Vernier line based on a plurality of delay stages.

14. The method of claim 12, wherein the thermometer code relates to least significant bits of the time-to-digital representation, and the method further comprises:
performing a sign bit decision relating to a most significant bit of the time-to-digital representation based upon the arrival time of the rising edge of the first signal and the rising edge of the second signal with respect to each other.

15. The method of claim 14, wherein the sign bit decision is performed in parallel with at least a portion of a processing time relating to the least significant bits of the time-to-digital representation.

16. The method of claim 14, wherein an output of the sign bit decision is concatenated with a binary representation of the thermometer code to obtain the time-to-digital representation.

17. The method of claim 10, wherein the method comprises determining least significant bits corresponding to the time-to-digital representation using a first circuit portion and determining a most significant bit corresponding to the time-to-digital representation using a second circuit portion, wherein the first circuit portion and the second circuit portion are configured to operate at least partially in parallel.

18. An apparatus, comprising:
a linear voltage to delay converter having a plurality of stages of dynamic gates, each of the plurality of stages of dynamic gates followed by at least one static gate, each of the plurality of stages of dynamic gates having a respective output node coupled to a respective constant current source using a respective pull-down path, wherein output nodes for all of the plurality of stages are pre-charged to an input analog voltage level and, sequentially for each of the plurality of stages so as to form a sequential release of each of the plurality of stages, the respective output node for a first one of the plurality of stages of dynamic gates is discharged in an evaluation phase with the respective constant current source using the respective pull-down path so as to reach the gate threshold of the following at least one static gate and change a voltage level of the following at least one static gate such that a subsequent one of the plurality of stages of dynamic gates is enabled for a corresponding evaluation phase there for.

19. The apparatus of claim 18, wherein a total delay of a given one of the plurality of stages is proportional to the input analog voltage level.

20. The apparatus of claim 18, wherein the sequential release reduces a pull down path leakage affect on the output nodes as the output nodes are discharged.

21. The apparatus of claim 18, wherein a delay between a rising edge of an output from the linear voltage to delay converter and a rising edge of a clock signal used to initiate the evaluation phase is proportional to the input analog voltage level.

22. A method, comprising:
performing a linear voltage to delay conversion using a linear voltage to delay converter having a plurality of stages of dynamic gates, each of the plurality of stages of dynamic gates followed by at least one static gate, each of the plurality of stages of dynamic gates having a respective output node coupled to a respective constant current source using a respective pull-down path, wherein said performing step comprises:

pre-charging output nodes for all of the plurality of stages to an input analog voltage level; and sequentially for each of the plurality of stages so as to form a sequential release of each of the plurality of stages, discharging in an evaluation phase the respective output node for a first one of the plurality of stages of dynamic gates with the respective constant current source using the respective pull-down path so as to reach a static gate threshold of the following at least one static gates and change a voltage level of the following at least one static gate such that a subsequent one of the plurality of stages of dynamic gates is enabled for a corresponding evaluation phase there for.

23. The method of claim 22, wherein a total delay of a given one of the plurality of stages is proportional to the input analog voltage level.

24. The method of claim 22, wherein the sequential release reduces a pull down path leakage affect on the output nodes as the output nodes are discharged.

25. The method of claim 22, wherein a delay between a rising edge of an output from the linear voltage to delay converter and a rising edge of a clock signal used to initiate the evaluation phase is proportional to the input analog voltage level.

* * * * *